United States Patent
Cheng et al.

(10) Patent No.: US 9,400,516 B2
(45) Date of Patent: Jul. 26, 2016

(54) VOLTAGE CONVERTING DEVICE

(71) Applicant: ILI TECHNOLOGY CORPORATION, Jhubei (TW)

(72) Inventors: Wei-Chung Cheng, Jhubei (TW); Shih-Hsin Hsu, Jhubei (TW); Lun-Kai Chang, Jhubei (TW)

(73) Assignee: ILI TECHNOLOGY CORPORATION, Jhubei (TW)

( * ) Notice: Subject to any disclaimer, the term of this patent is extended or adjusted under 35 U.S.C. 154(b) by 25 days.

(21) Appl. No.: 14/248,827

(22) Filed: Apr. 9, 2014

(65) Prior Publication Data

US 2014/0306684 A1    Oct. 16, 2014

(30) Foreign Application Priority Data

Apr. 11, 2013    (TW) .............................. 102112860 A

(51) Int. Cl.
*H03K 19/094*    (2006.01)
*G05F 3/08*      (2006.01)
*H03K 19/0185*   (2006.01)

(52) U.S. Cl.
CPC .......... *G05F 3/08* (2013.01); *H03K 19/018514* (2013.01)

(58) Field of Classification Search
CPC .................. H03K 19/0013; H03K 19/018521; H03K 3/356113; G09G 3/2611
USPC ................... 327/62, 108, 333, 543, 437, 229; 326/82, 83, 86, 93, 95, 121
See application file for complete search history.

(56) References Cited

U.S. PATENT DOCUMENTS

| | | | | |
|---|---|---|---|---|
| 5,539,334 A * | 7/1996 | Clapp, III | ........ | H03K 3/356017 326/30 |
| 6,163,215 A * | 12/2000 | Shibata | ................ | H03G 1/0023 327/359 |
| 6,366,505 B1 * | 4/2002 | Fournel | ................ | H03K 17/102 327/530 |
| 6,563,372 B1 * | 5/2003 | Fournel | ................ | H03K 17/102 327/333 |
| 7,872,499 B2 * | 1/2011 | Tsuchi | ..................... | G09G 3/20 326/62 |
| 7,956,641 B1 * | 6/2011 | Peng | ................ | H03K 3/356182 326/62 |
| 8,400,207 B2 * | 3/2013 | Tsuchi | ..................... | G09G 3/20 326/82 |
| 8,742,821 B2 * | 6/2014 | Liu | ........................ | H03K 3/012 326/80 |

FOREIGN PATENT DOCUMENTS

TW    200723678    6/2007
TW    201014177 A  4/2010

OTHER PUBLICATIONS

Search report for TW10211286, dated Nov. 28, 2014.

* cited by examiner

*Primary Examiner* — Rajnikant Patel
(74) *Attorney, Agent, or Firm* — Foley Hoag LLP

(57) ABSTRACT

A voltage converting device includes first and second stage circuits for converting a differential voltage to an output signal that has a magnitude smaller than the differential voltage. The second stage circuit includes input transistors for receiving voltages from the first stage circuit, output transistors for outputting the output signal, and a clamp module to clamp voltages at the input transistors of the second stage circuit.

6 Claims, 4 Drawing Sheets

VOLTAGE CONVERTING DEVICE

CROSS-REFERENCE TO RELATED APPLICATION

This application claims priority to Taiwanese Application No. 102112860, filed on Apr. 11, 2013.

BACKGROUND OF THE INVENTION

1. Field of the Invention

The invention relates to a converting device, and more particularly to a voltage converting device.

2. Description of the Related Art

FIG. 1 and FIG. 2 illustrate a conventional voltage converting device that includes a first stage circuit 11, a second stage circuit 12 and a third stage circuit 13.

The first stage circuit 11 receives and converts complementary input signals DIN, DIP into complementary first-stage output signals D1, D1B, where each of the input signals DIN, DIP has a voltage magnitude ranging between VDD and GND, and each of the first-stage output signals D1, D1B has a voltage magnitude ranging between VDD and VNN, as shown in FIG. 1.

The second stage circuit 12 receives and converts either one of the first-stage output signals D1, D1B into complementary second-stage output signals D2, D2B each having a voltage magnitude ranging between GND and VNN, as shown in FIG. 1.

The third stage circuit 13 receives and converts the second-stage output signals D2, D2B into complementary output signals OUT, OUTB each having a voltage magnitude ranging between GND and VEE, as shown in FIG. 1.

When the input signals are directly converted into the output signals with VDD=1.5V and VEE=−6V, the maximum voltage applied to the circuit components is 7.5V. When voltage conversion from the input signals to the output signals is divided into three conversion circuit stages as shown in FIG. 2 with GND=0V and VNN=−3V, the first-stage output signals D1, DIB range between 1.5V and −3V, the second-stage output signals D2, D2B range between 0V and −3V, and the output signals OUT, OUTB range between 0V and −6V, thereby reducing the maximum voltage applied to the circuit components to 6V, and circuit components with lower rated voltage ranges may be used in the circuit.

However, more conversion circuit stages may result in more power consumption.

SUMMARY OF THE INVENTION

Therefore, an object of the present invention is to provide a voltage converting device that has relatively fewer conversion circuit stages and that may have lower power consumption.

According to the present invention, a voltage converting device is adapted to receive a first voltage, a second voltage lower than the first voltage, a third voltage lower than the second voltage, and a fourth voltage lower than the third voltage, and comprises:

a first stage circuit configured to convert a differential voltage, which ranges between the first voltage and the second voltage, to a first stage differential output (DO) signal having a magnitude ranging between the first voltage and the third voltage, the first stage DO signal including complementary first and second single-ended output voltages; and a second stage circuit configured to convert the first stage DO signal to an output signal that has a magnitude ranging between the second voltage and the fourth voltage, the output signal including complementary first and second output voltages, the second stage circuit including:

a first input transistor having a first terminal disposed to receive the second voltage, a second terminal, and a control terminal disposed to receive the first single-ended output voltage;

a second input transistor having a first terminal disposed to receive the second voltage, a second terminal, and a control terminal disposed to receive the second single-ended output voltage;

a second-stage clamp module coupled to the second terminal of the first input transistor and the second terminal of the second input transistor, and configured to clamp a voltage at each of the first input transistor and the second input transistor;

a first output transistor having a first terminal that is coupled to the second-stage clamp module and that outputs the second output voltage, a second terminal disposed to receive the fourth voltage, and a control terminal; and a second output transistor having a first terminal that is coupled to the second-stage clamp module and the control terminal of the first output transistor and that outputs the first output voltage, a second terminal disposed to receive the fourth voltage, and a control terminal coupled to the first terminal of the first output transistor.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
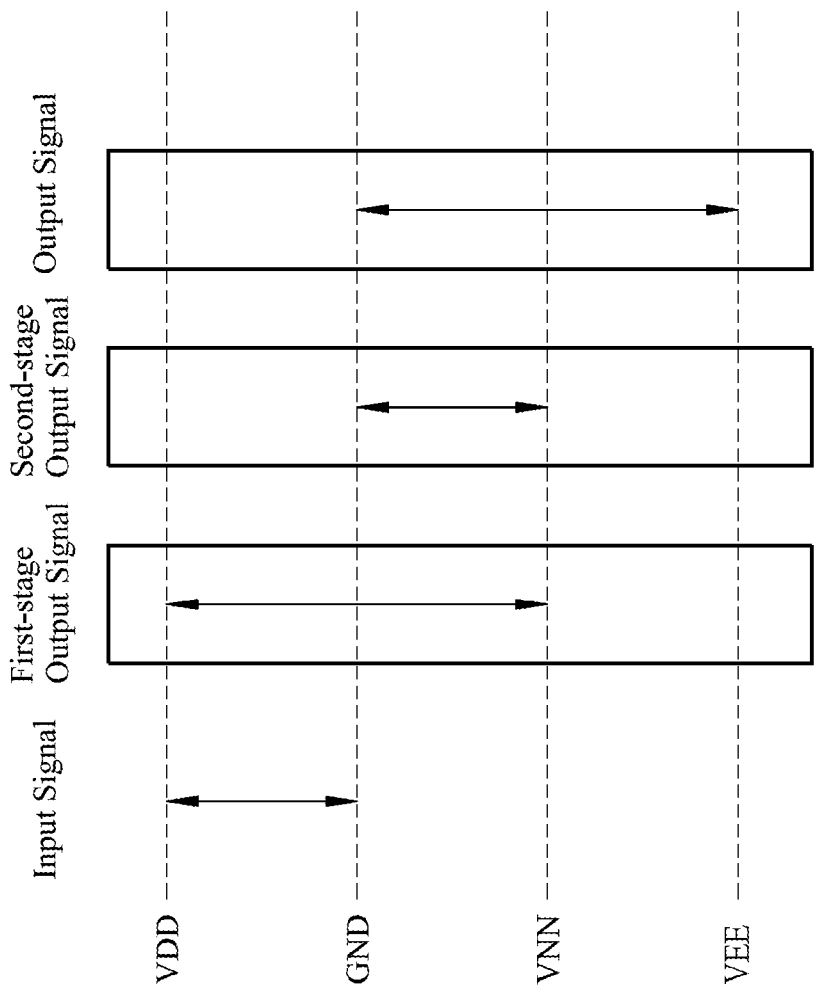
FIG. 1 is a schematic diagram illustrating input and output voltage ranges of circuit stages of a conventional voltage converting device.
Figure 2:
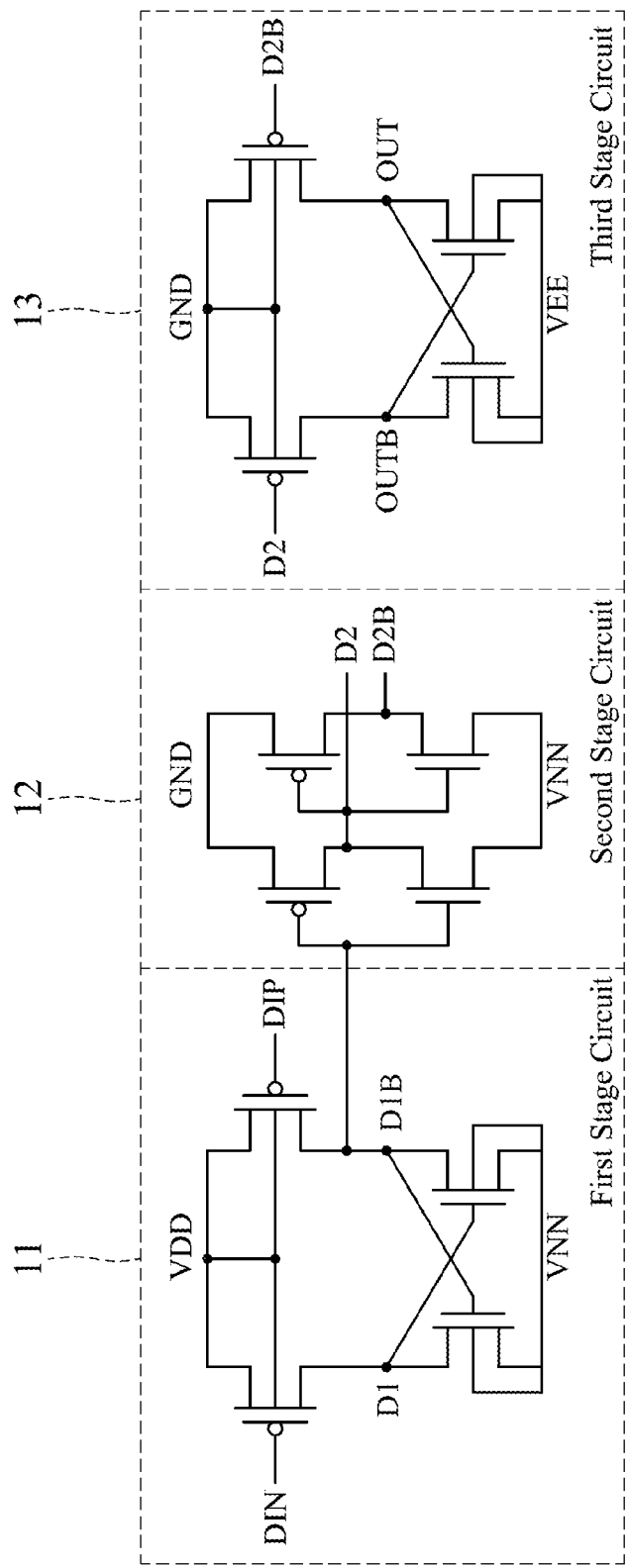
FIG. 2 is a schematic circuit diagram showing the conventional voltage converting device.
Figure 3:
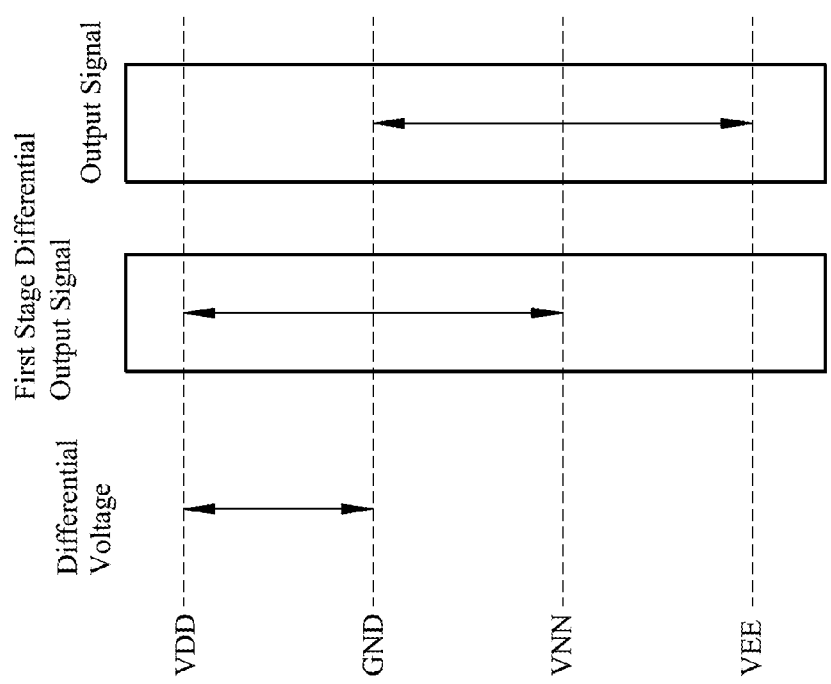
FIG. 3 is a schematic diagram illustrating input and output voltage ranges of circuit stages of a preferred embodiment of a voltage converting device according to the present invention.
Figure 4:
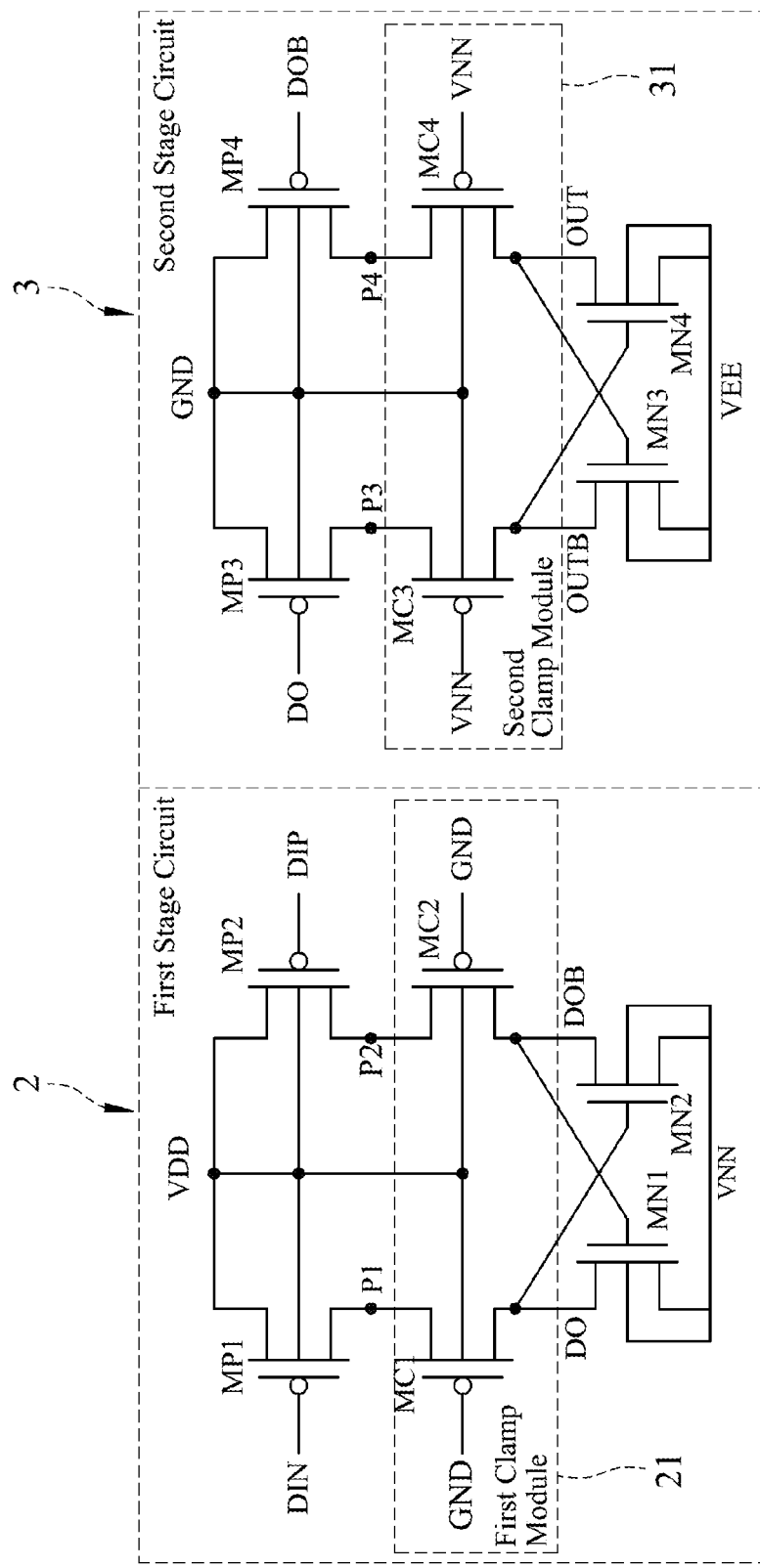
FIG. 4 is a schematic circuit diagram showing the preferred embodiment.

Referring to FIG. 3 and FIG. 4, the preferred embodiment of the voltage converting device according to this invention is shown to include a first stage circuit 2 and a second stage circuit 3, and receives a first voltage VDD, a second voltage GND lower than the first voltage VDD, a third voltage VNN lower than the second voltage GND, and a fourth voltage VEE lower than the third voltage VNN.

The first stage circuit 2 converts a differential voltage, which ranges between the first voltage VDD and the second voltage GND and includes complementary first and second single-ended voltages DIP, DIN, to a first stage differential output signal having a magnitude ranging between the first voltage VDD and the third voltage VNN. The first stage differential output signal includes complementary first and second single-ended output voltages DO, DOB.

The first stage circuit 2 includes input transistors MP1, MP2, output transistors MN1, MN2, and a first-stage clamp module 21.

The input transistor MP1 has a first terminal receiving the first voltage VDD, a second terminal, and a control terminal receiving the second single-ended voltage DIN.

The input transistor MP2 has a first terminal receiving the first voltage VDD, a second terminal, and a control terminal receiving the first single-ended voltage DIP.

The first-stage clamp module 21 is coupled to the second terminals of the input transistors MP1, MP2, and clamps a voltage at each of the input transistors MP1, MP2. The first-stage clamp module 21 includes clamp transistors MC1, MC2.

The clamp transistor MC1 has a first terminal coupled to the second terminal of the input transistor MP1, a second terminal, arida control terminal receiving a first bias voltage, which is the second voltage GND in this embodiment and which is for enabling conduction of the clamp transistor MC1.

The clamp transistor MC2 has a first terminal coupled to the second terminal of the input transistor MP2, a second terminal, and a control terminal receiving the first bias voltage for enabling conduction of the clamp transistor MC2.

The output transistor MN1 has a first terminal that is coupled to the second terminal of the clamp transistor MC1 and that outputs the first single-ended output voltage DO, a second terminal receiving the third voltage VNN, and a control terminal.

The output transistor MN2 has a first terminal that is coupled to the second terminal of the clamp transistor MC2 and the control terminal of the output transistor MN1 and that outputs the second single-ended output voltage DOB, a second terminal receiving the third voltage VNN, and a control terminal coupled to the first terminal of the output transistor MN1.

In this embodiment, the input transistors MP1, MP2 are devices that operate within a lower voltage range compared to the clamp transistors MC1, MC2 and the output transistors MN1, MN2, but the present invention should not be limited thereto.

In this embodiment, the input transistors MP1, MP2 and the clamp transistors MC1, MC2 are P-type metal-oxide-semiconductor field-effect transistors (MOSFETs), and the output transistors MN1, MN2 are N-type MOSFETs, but the present invention should not be limited thereto.

The second stage circuit 3 converts the first stage differential output signal from the first stage circuit 2 to an output signal that has a magnitude ranging between the second voltage GND and the fourth voltage VEE. The output signal includes complementary first and second output voltages OUT, OUTB.

The second stage circuit 3 includes input transistors MP3, MP4, output transistors MN3, MN4, and a second-stage clamp module 31.

The input transistor MP3 has a first terminal receiving the second voltage GND, a second terminal, and a control terminal receiving the first single-ended voltage DO.

The input transistor MP4 has a first terminal receiving the second voltage GND, a second terminal, and a control terminal receiving the second single-ended voltage DOB.

The second-stage clamp module 31 is coupled to the second terminals of the input transistors MP3, MP4, and clamps a voltage at each of the input transistors MP3, MP4. The second-stage clamp module 31 includes clamp transistors MC3, MC4.

The clamp transistor MC3 has a first terminal coupled to the second terminal of the input transistor MP3, a second terminal, and a control terminal receiving a second bias voltage, which is the third voltage VNN in this embodiment and which is for enabling conduction of the clamp transistor MC3.

The clamp transistor MC4 has a first terminal coupled to the second terminal of the input transistor MP4, a second terminal, and a control terminal receiving the second bias voltage for enabling conduction of the clamp transistor MC4.

The output transistor MN3 has a first terminal that is coupled to the second terminal of the clamp transistor MC3 and that outputs the second output voltage OUTB, a second terminal receiving the fourth voltage VEE, and a control terminal.

The output transistor MN4 has a first terminal that is coupled to the second terminal of the clamp transistor MC4 and the control terminal of the output transistor MN3 and that outputs the first output voltage OUT, a second terminal receiving the fourth voltage VEE, and a control terminal coupled to the first terminal of the output transistor MN3.

In this embodiment, the input transistors MP3, MP4 and the clamp transistors MC3, MC4 are P-type metal-oxide-semiconductor field-effect transistors (MOSFETs), and the output transistors MN3, MN4 are N-type MOSFETs, but the present invention should not be limited thereto.

The following example uses VDD=1.5V, GND=0V, VNN=−3V and VEE=−6V as operation conditions of the voltage converting device of this invention, and the threshold voltages of the transistors are ignored for the sake of clarity.

In this case, since the first bias voltage is the second voltage GND (0V), the first clamp module 21 clamps the voltages at nodes P1, P2 to 0V, thereby limiting the voltage applied to each of the input transistors MP1, MP2 to range between 1.57 and 0 V (VDD~GND), so that the input transistors MP1, MP2 may be devices that operate within a lower voltage range compared to other transistors while preventing breakdown.

Similarly, since the second bias voltage is the third voltage VNN (−3V), the second clamp module 31 clamps the voltages at nodes P3, P4 to −3V, thereby limiting the voltage applied to each of the input transistors MP3, MP4 to range between 1.5V and −3V (VDD~GND), so that breakdown of the input transistors MP3, MP4 may be prevented.

By virtue of the second clamp module 31 that clamps the voltages at nodes P3 and P4 of the input transistors MP3, MP4, the voltage across the control and second terminals of each of the input transistors MP3, MP4 may be reduced, thereby preventing breakdown. Voltage conversion can thus be completed using only two circuit stages, and power consumption is accordingly reduced.

By virtue of the first clamp module 21 that clamps the voltages at nodes P1 and P2 of the input transistors MP1, MP2, the voltage across the control and second terminals of each of the input transistors MP1, MP2 may be reduced, so that the input transistors MP1, MP2 may be devices that are designed to operate within a lower voltage range, thereby reducing circuit area and cost.

To sum up, the voltage converting device of this invention may reduce not only the circuit stages and power consumption, but also the circuit area and cost.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A voltage converting device adapted to receive a first voltage, a second voltage lower than the first voltage, a third voltage lower than the second voltage, and a fourth voltage lower than the third voltage, said voltage converting device comprising:
- a first stage circuit configured to convert a differential voltage, which ranges between the first voltage and the second voltage, to a first stage differential output (DO) signal having a magnitude ranging between the first voltage and the third voltage, the first stage DO signal including complementary first and second single-ended output voltages; and
- a second stage circuit configured to convert the first stage DO signal to an output signal that has a magnitude ranging between the second voltage and the fourth voltage, the output signal including complementary first and second output voltages, said second stage circuit including:
  - a first input transistor having a first terminal disposed to receive the second voltage, a second terminal, and a control terminal disposed to receive the first single-ended output voltage;
  - a second input transistor having a first terminal disposed to receive the second voltage, a second terminal, and a control terminal disposed to receive the second single-ended output voltage;
  - a second-stage clamp module coupled to said second terminals of said first and second input transistors, and configured to clamp a voltage at each of said first and second input transistors;
  - a first output transistor having a first terminal that is coupled to said second-stage clamp module and that outputs the second output voltage, a second terminal disposed to receive the fourth voltage, and a control terminal; and
  - a second output transistor having a first terminal that is coupled to said second-stage clamp module and said control terminal of said first output transistor and that outputs the first output voltage, a second terminal disposed to receive the fourth voltage, and a control terminal coupled to said first terminal of said first output transistor.

2. The voltage converting device as claimed in claim 1, wherein the differential voltage includes complementary first and second single-ended voltages, said first stage circuit including:
- a third input transistor having a first terminal disposed to receive the first voltage, a second terminal, and a control terminal disposed to receive the second single-ended voltage;
- a fourth input transistor having a first terminal disposed to receive the first voltage, a second terminal, and a control terminal disposed to receive the first single-ended voltage;
- a first-stage clamp module coupled to said second terminals of said third and fourth input transistors, and configured to clamp a voltage at each of said third and fourth input transistors;
- a third output transistor having a first terminal that is coupled to said first-stage clamp module and that outputs the first single-ended output voltage, a second terminal disposed to receive the third voltage, and a control terminal; and
- a fourth output transistor having a first terminal that is coupled to said first-stage clamp module and said control terminal of said third output transistor and that outputs the second single-ended output voltage, a second terminal disposed to receive the third voltage, and a control terminal coupled to said first terminal of said third output transistor.

3. The voltage converting device as claimed in claim 2, wherein said first-stage clamp module includes:
- a first clamp transistor having a first terminal coupled to said second terminal of said third input transistor, a second terminal coupled to said first terminal of said third output transistor, and a control terminal disposed to receive a first bias voltage; and
- a second clamp transistor having a first terminal coupled to said second terminal of said fourth input transistor, a second terminal coupled to said first terminal of said fourth output transistor, and a control terminal disposed to receive the first bias voltage.

4. The voltage converting device as claimed in claim 3, wherein said third input transistor, said fourth input transistor, said first clamp transistor, and said second clamp transistor of said first stage circuit are P-type metal-oxide-semiconductor field-effect transistors (MOSFETs); and
said third output transistor and said fourth output transistor of said first stage circuit are N-type MOSFETs.

5. The voltage converting device as claimed in claim 1, wherein said second-stage clamp module includes:
- a first clamp transistor having a first terminal coupled to said second terminal of said first input transistor, a second terminal coupled to said first terminal of said first output transistor, and a control terminal disposed to receive a second bias voltage; and
- a second clamp transistor having a first terminal coupled to said second terminal of said second input transistor, a second terminal coupled to said first terminal of said second output transistor, and a control terminal disposed to receive the second bias voltage.

6. The voltage converting device as claimed in claim 5, wherein said first input transistor, said second input transistor, said first clamp transistor, and said second clamp transistor of said second stage circuit are P-type metal-oxide-semiconductor field-effect transistors (MOSFETs); and
said first output transistor and said second output transistor of said second stage circuit are N-type MOSFETs.

* * * * *